(12) United States Patent
Ryu et al.

(10) Patent No.: US 9,456,492 B2
(45) Date of Patent: Sep. 27, 2016

(54) PRINTED CIRCUIT BOARD WITH WARPAGE PREVENTION LAYER

(71) Applicant: Samsung Electro-Mechanics Co., Ltd., Suwon (KR)

(72) Inventors: Joung Gul Ryu, Yongin (KR); Dong Hoon Kim, Sungnam (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/290,312

(22) Filed: May 29, 2014

(65) Prior Publication Data

US 2015/0245484 A1    Aug. 27, 2015

(30) Foreign Application Priority Data

Feb. 21, 2014   (KR) .................. 10-2014-0020493

(51) Int. Cl.
| | |
|---|---|
| *H05K 1/02* | (2006.01) |
| *H05K 1/11* | (2006.01) |
| *H05K 3/00* | (2006.01) |
| *H05K 3/10* | (2006.01) |
| *H05K 3/42* | (2006.01) |

(52) U.S. Cl.
CPC ............ *H05K 1/0271* (2013.01); *H05K 1/112* (2013.01); *H05K 3/0014* (2013.01); *H05K 3/0017* (2013.01); *H05K 3/0044* (2013.01); *H05K 3/103* (2013.01); *H05K 3/429* (2013.01); *H05K 2201/09781* (2013.01); *H05K 2203/061* (2013.01); *Y10T 156/103* (2015.01)

(58) Field of Classification Search
None
See application file for complete search history.

(56) References Cited

U.S. PATENT DOCUMENTS

| | | | | |
|---|---|---|---|---|
| 5,733,823 | A * | 3/1998 | Sugioka et al. | 442/110 |
| 2009/0008136 | A1* | 1/2009 | Ikeguchi et al. | 174/255 |
| 2011/0061905 | A1* | 3/2011 | Hwang et al. | 174/255 |
| 2012/0018863 | A1* | 1/2012 | Oganesian et al. | 257/676 |

FOREIGN PATENT DOCUMENTS

| | | |
|---|---|---|
| KR | 10-2008-0096985 | 11/2008 |
| KR | 10-2013-0136248 | * 12/2013 |

* cited by examiner

*Primary Examiner* — Daniel Luke
(74) *Attorney, Agent, or Firm* — NSIP Law

(57) ABSTRACT

Disclosed herein are a printed circuit board and a method of manufacturing the same. According to an exemplary embodiment of the present invention, the printed circuit board includes: a first insulating layer in which a metal layer is embedded; a warpage prevention layer stacked on the first insulating layer; second insulating layers stacked on both surfaces of the first insulating layer; a via formed on the second insulating layer to be connected to the metal layer; and a solder resist layer stacked on the second insulating layer.

9 Claims, 8 Drawing Sheets

PRINTED CIRCUIT BOARD WITH WARPAGE PREVENTION LAYER

CROSS-REFERENCE TO RELATED APPLICATIONS

This application claims the foreign priority benefit under 35 U.S.C. Section 119 of Korean Patent Application Serial No. 10-2014-0020493, entitled "Printed Circuit Board And Method Of Manufacturing The Same" filed on Feb. 21, 2014, which is hereby incorporated by reference in its entirety into this application.

BACKGROUND

1. Field

The present invention relates to a printed circuit board and a method of manufacturing the same, and more particularly, to a printed circuit board including a metal layer inserted therein so as to have enhanced thermal conductivity and a method of manufacturing the same.

2. Description of the Related Art

As a demand for thin and multi-functional electronic products in addition to a mobile phone is increased, various types of electronic parts mounted in the electronic products are inclined to be miniaturization, high density, and thinness. Therefore, research into a thin and multi-functional semiconductor package manufactured by various electronic parts has been actively conducted.

In particular, in a multi chip package (MCP) type of vertically stacking a plurality of semiconductor chips on one substrate, a package on package (POP) type of stacking a plurality of substrates on which semiconductor chips are mounted, or the like, it is essential to develop a substrate having excellent warpage characteristics so as to have a thermal expansion behavior having a similar level to that of the semiconductor chip.

Recently, as a development of high-performance mobile phones or multimedia devices is accelerated and a demand for a high-performance and high-density semiconductor chip is increased, a heat generation problem of the package has emerged as a solution. Therefore, a development of a printed circuit board meeting composite characteristics such as the heat generation problem in addition to the warpage characteristics, has been required.

To develop the printed circuit board, a method of manufacturing a printed circuit board by inserting metal materials, such as copper (Cu) and aluminum (Al) having excellent thermal conductivity, into a core generally configuring a printed circuit board or a method of improving thermal conductivity of an insulating layer by mixing fillers, such as alumina and boron nitride having excellent thermal conductivity, with the insulating layer in addition to the core has been mainly used.

However, when the metal materials, such as aluminum and copper, are applied to the core, the thermal conductivity characteristics of the printed circuit board may be improved, but since the semiconductor chips are mounted on an upper surface of the printed circuit board and then suffer from a high temperature reflow process, the warpage characteristics may be more remarkably reduced than the printed circuit board configured of the general insulating layer.

RELATED ART DOCUMENT

Patent Document (Patent Document 1) Korean Patent-Laid Open Publication No. 2008-0096985

SUMMARY

An object of the present invention is to provide a printed circuit board having improved thermal conductivity by embedding a metal layer into an insulating layer of a central portion of a printed circuit board and having rigidity against warpage by mounting a warpage prevention layer on the insulating layer and a method of manufacturing the same.

According to an exemplary embodiment of the present invention, there is provided a printed circuit board, including: a first insulating layer in which a metal layer is embedded; a warpage prevention layer stacked on the first insulating layer; second insulating layers stacked on both surfaces of the first insulating layer; a via formed on the second insulating layer to be connected to the metal layer; and a solder resist layer stacked on the second insulating layer.

The printed circuit board may further include: a pad connected to the via on the second insulating layer; and an external connection unit electrically connected to the pad and disposed around an opening of the solder resistor.

The first insulating layer may be made of prepreg formed by impregnating a resin material into a fabric cloth or a glass cloth and the prepreg may be further impregnated with organic filler.

The warpage prevention layer may be formed on one surface or both surfaces of the first insulating layer.

The warpage prevention layer may be made of metal materials of invar or alloys having a low coefficient of thermal expansion.

The warpage prevention layer may be formed at an outer side of an exposed area of the metal layer which penetrates through the first insulating layer, and the warpage prevention layer may extend onto the metal layer which is exposed on the first insulating layer.

The metal layers may be bonded to each other in the first insulating layer by an adhesive layer, and the adhesive layer may be made of a conductive paste or a conductive polymer.

According to another exemplary embodiment of the present invention, there is provided a method of manufacturing a printed circuit board, including: preparing a metal base on which a metal layer and a metal material are stacked; forming a circuit by patterning the metal layer; embedding the metal layer in a first insulating layer by pressing the metal base provided with a circuit on both surfaces of the first insulating layer; forming a warpage prevention layer by patterning the metal materials coated on both surfaces of the first insulating layer; stacking a second insulating layer on the first insulating layer; forming a via hole in the second insulating layer and forming a via and a pad by patterning a plating layer formed on the second insulating layer including the via hole; and stacking a solder resist layer on the second insulating layer and forming an external connection unit on the pad exposed through an opening of the solder resist layer.

According to still another exemplary embodiment of the present invention, there is provided a method of manufacturing a printed circuit board, including: preparing a metal base on which a metal layer and a metal material are stacked; forming a circuit by patterning the metal layer; embedding the metal layer in a first insulating layer to protrude an end of the metal layer by pressing the metal base provided with a circuit on one surface of the first insulating layer; grinding the metal layer protruding on the first insulating layer; forming a warpage prevention layer by patterning the metal materials coated on one surface of the first insulating layer; stacking a second insulating layer on the first insulating layer; forming a via hole in the second insulating layer and forming a via and a pad by patterning a plating layer formed on the second insulating layer including the via hole; and stacking a solder resist layer on the second insulating layer and forming an external connection unit on the pad exposed through an opening of the solder resist layer.

BRIEF DESCRIPTION OF THE DRAWINGS

These and/or other aspects and advantages will become apparent and more readily appreciated from the following description of the embodiments, taken in conjunction with the accompanying drawings of which:

FIG. 2A is a cross-sectional view of a metal base and FIGS. 2B and 2C are cross-sectional views of a patterned metal layer of the metal base.

FIGS. 2D and 2E are cross-sectional views of a state in which the metal layer is embedded into the insulating layer.

FIGS. 2F and 2G are cross-sectional views of a warpage prevention layer disposed on the insulating layer.

FIGS. 2H and 2I are cross-sectional views of a state in which a second insulating layer is stacked.

FIG. 2J is a cross-sectional view of a state in which a circuit is formed on the second insulating layer.

FIG. 2K is a cross-sectional view of a solder resist stacked on the second insulating layer.

FIG. 4A is a cross-sectional view of a metal base.

FIGS. 4B and 4C are cross-sectional views of a patterned metal layer of the metal base.

FIGS. 4D and 4E are cross-sectional views of a state in which the metal layer is embedded into the insulating layer.

FIGS. 4F and 4G are cross-sectional views of a warpage prevention layer disposed on the insulating layer.

FIGS. 4H and 4I are cross-sectional views of a state in which a second insulating layer is stacked.

FIG. 4J is a cross-sectional view of a state in which a circuit is formed on the second insulating layer.

FIG. 4K is a cross-sectional view of a solder resist stacked on the second insulating layer.

FIG. 5A is a cross-sectional view of a metal base.

FIGS. 5B and 5C are cross-sectional views of a patterned metal layer of the metal base.

FIGS. 5D and 5E are cross-sectional views of a state in which the metal layer is embedded into the insulating layer.

FIG. 5F is a cross-sectional view of a state in which the metal layer is ground.

FIGS. 5G and 5H are cross-sectional views of a warpage prevention layer disposed on the insulating layer.

FIGS. 5I and 5J are cross-sectional views of a state in which a second insulating layer is stacked.

FIG. 5K is a cross-sectional view of a state in which a circuit is formed on the second insulating layer.

FIG. 5L is a cross-sectional view of a solder resist stacked on the second insulating layer.

DETAILED DESCRIPTION

Matters of an action effect and a technical configuration of a printed circuit board and a method of manufacturing the same according to an exemplary embodiment of the present invention to achieve the above object will be clearly obvious by the following detailed description with reference to the drawings which illustrate exemplary embodiments of the present invention.

First Exemplary Embodiment of Printed Circuit Board

Figure 1:
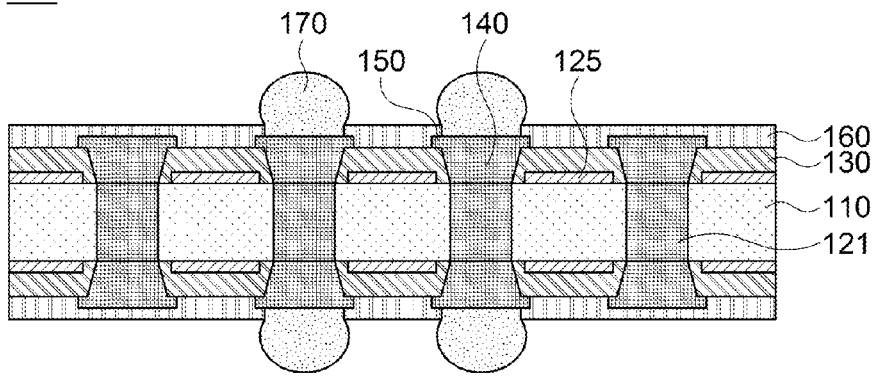
FIG. 1 is a cross-sectional view of a printed circuit board according to a first exemplary embodiment of the present invention.

First, FIG. 1 is a cross-sectional view of a printed circuit board according to a first exemplary embodiment of the present invention.

As illustrated in FIG. 1, a printed circuit board 100 according to the first exemplary embodiment of the present invention may be configured of a first insulating layer 110 into which a metal layer 121 is inserted, warpage prevention layers 125 which are stacked on both surfaces of the first insulating layer 110, second insulating layers 130 which are stacked on both surfaces of the first insulating layer 110, vias 140 which are formed on the second insulating layer 130 to be connected to the metal layer 121, and a solder resist layer 160 which is stacked on the second insulating layer 130.

Further, in the printed circuit board 100, a plurality of pads 150 which are connected to the vias 140 may be disposed on the second insulating layer 130 and external connection units 170 electrically connected to the pads 150 may be disposed around an opening of the solder resist layer 160.

In this case, the external connection unit 170 is a solder ball, a bump, a pad, or the like and may be formed around the opening of the solder resist layer 160 in a protruding form.

The first insulating layer 110 may be made of a general resin material and may be made of prepreg (PPG) having rigidity by impregnating the resin material into a fabric cloth or a glass cloth. Further, the first insulating layer 100 may be formed of an insulating layer having improved rigidity and coefficient of thermal expansion (CTE) by further impregnating organic filler in the prepreg.

The first insulating layer 110 is provided with the metal layer 121, in which the metal layer 121 may be configured in a form in which the metal layer penetrates through the first insulating layer 110 and an upper portion and a lower portion thereof may be formed to be exposed to an outer side of the first insulating layer 110. The metal layer 121 is made of a metal material having good conductivity and may be made of copper (Cu) which is mainly used at the time of forming a circuit pattern.

The metal layer 121 may serve to increase rigidity against warpage by improving a residual rate of copper (Cu) within the printed circuit board.

Meanwhile, the warpage prevention layer 125 may be disposed on the first insulating layer 110. The warpage prevention layer 125 may be disposed on one surface or both surfaces of the first insulating layer 110 and may be formed at a thickness relatively smaller than that of the first insulating layer 110. The warpage prevention layer 125 is made of a metal material having a low CTE and may mainly be made of metal materials of invar or alloys. Meanwhile, the warpage prevention layer 125 is stacked on the first insulating layer having predetermined rigidity thanks to the prepreg material to further enhance the rigidity against warpage.

In this case, the thickness of the warpage prevention layer 125 may be formed at a thickness of about 5 to 10% or 3 to 10 μm of the thickness of the first insulating layer and when the warpage prevention layer 125 is equal to or less than 3 μm, the adding effect of rigidity to the first insulating layer is insignificant and when the warpage prevention layer 125 is equal to or more than 10 μm, an overall thickness of the printed circuit board may be increased and thus it may be difficult to achieve a purpose of thinness. Further, when the warpage prevention layer 125 is formed at a thickness of 30% or more of the thickness of the second insulating layer 130, electrical stability between layers may be reduced.

Further, the warpage prevention layer 125 is disposed on the first insulating layer 110 but may be formed so as not to contact the metal layer 121 penetrating through the first insulating layer 110. That is, since the warpage prevention layer 125 is made of a metal material, when the warpage prevention layer contacts the metal layer 121, a product defect due to a short may occur and therefore the warpage prevention layer 125 may be formed at an outer side of an exposed area of the metal layer 121 of the upper and lower portions of the first insulating layer 110.

In this case, the warpage prevention layer 125 may be stacked to extend onto the metal layer 121 adjacent to the first insulating layer 110. When the warpage prevention layer 125 is stacked on the metal layer 121, the warpage prevention layer 125 may extend onto the metal layer 121 which is not electrically connected to the via 140 and the via 140 may be selectively connected on the metal layer 121 on which the warpage prevention layer 125 is not formed.

As described above, when the warpage prevention layer 125 extends onto the metal layer 121 to which the via 140 is not connected, the rigidity may be further added to the first insulating layer 110 by an extending length of the warpage prevention layer 125.

The second insulating layer 130 may be stacked on the first insulating layer 110 on which the warpage prevention layer 125 is stacked. The second insulating layer 130 may be made of an insulating material of a resin material and may serve to insulate between the metal layer 121 and the warpage prevention layer 125 on the first insulating layer 110. Further, via holes are machined in the second insulating layer 130 and is thus filled with a plating material to form the vias 140. The via 140 is selectively connected to the metal layer 121 disposed on the first insulating layer 110 and the metal layer 121 may serve to conduct between the upper and lower portion of the printed circuit board through the plurality of vias 140.

The via 140 may be provided with a via hole by a chemical machining method using etching, and the like and a mechanical machining method using laser drilling and may be formed by filling metal materials such as copper (Cu) in the via hole using a plating or printing method. Further, at the time of forming the via 140, the metal material is stacked on a surface of the second insulating layer 130 and a patterned pad 150 may be provided by etching the stacked metal material. In this case, the pad 150 may be selectively connected to the external connection unit 170 such as a solder ball and a bump and may be configured of a circuit having a fine pitch according to a design specification of the printed circuit board.

A solder resist layer 160 to protect the patterned circuit may be further stacked on the second insulating layer 130. The opening is formed on the solder resist layer 160 such that the pad 150 formed on the second insulating layer 130 may be exposed through the opening and the external connection unit 170 may be disposed on the pad 150 exposed through the opening.

First Exemplary Embodiment of Method of Manufacturing Printed Circuit Board

A detailed method of manufacturing a printed circuit board according to the exemplary embodiment of the present invention configured as described above will be clearly understood by the following detailed description.

Figure 2A:
FIGS. 2A through 2K are process cross-sectional views illustrating a process of manufacturing a printed circuit board according to the first exemplary embodiment of the present invention.
Figure 2B:
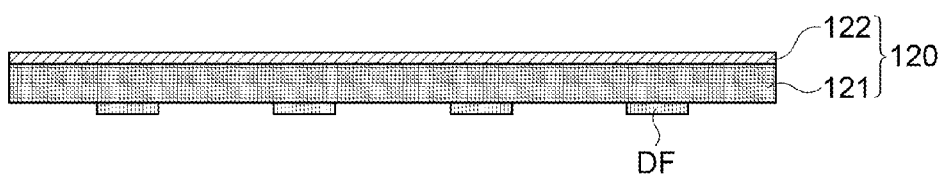
Figure 2C:
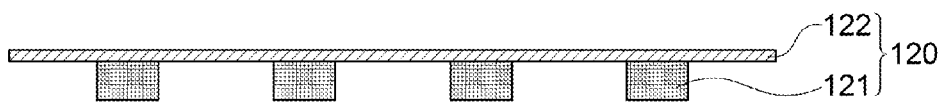
Figure 2D:
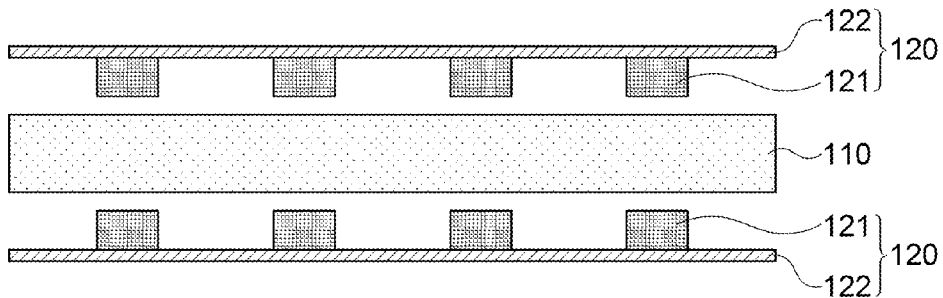
Figure 2E:
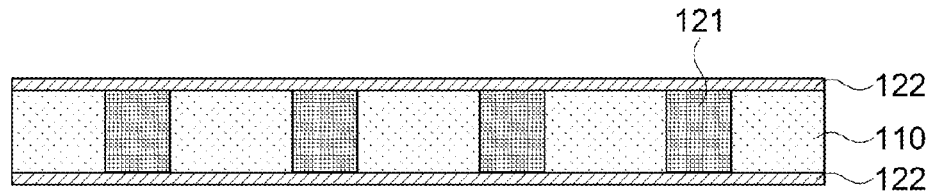
Figure 2F:
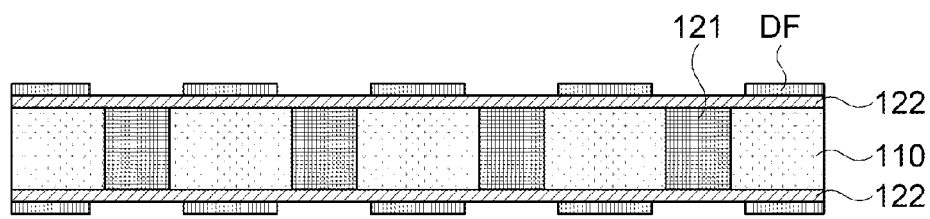
Figure 2G:
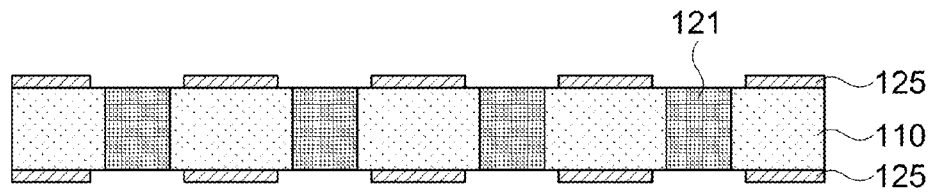
Figure 2H:
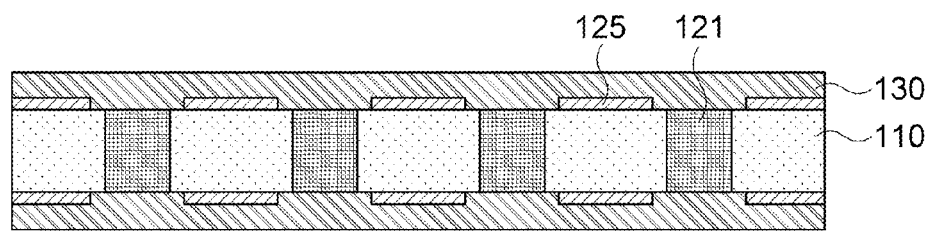
Figure 2I:
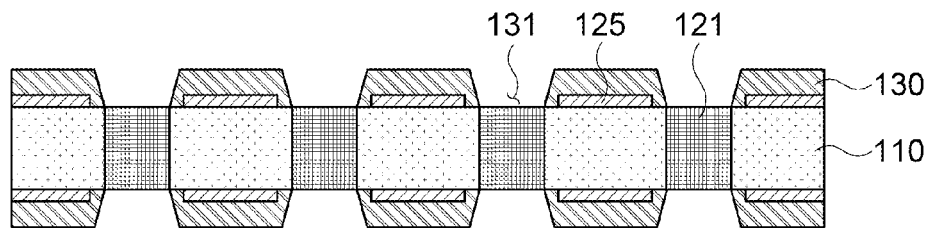
Figure 2J:
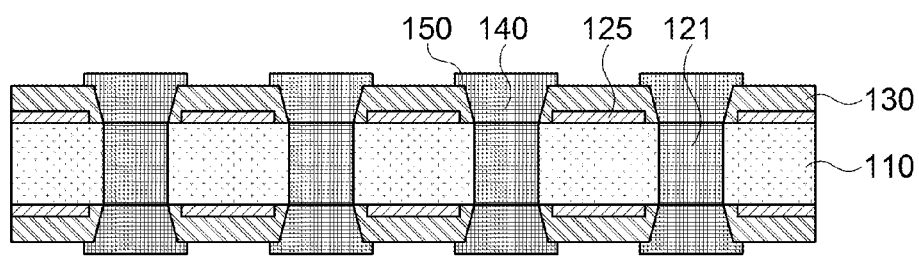
Figure 2K:
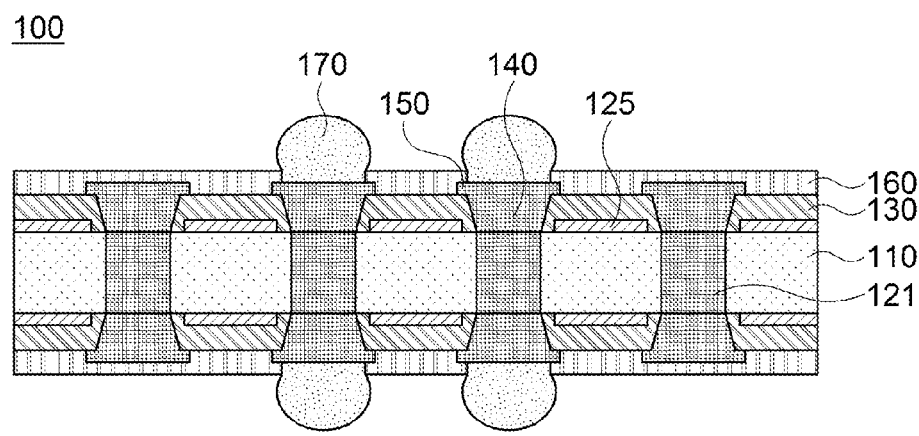

FIGS. 2A through 2K are process cross-sectional views illustrating a process of manufacturing a printed circuit board according to the first exemplary embodiment of the present invention, in which FIG. 2A is a cross-sectional view of a metal base and FIGS. 2B and 2C are cross-sectional views of a patterned metal layer of the metal base, FIGS. 2D and 2E are cross-sectional views of a state in which the metal layer is embedded into the insulating layer, FIGS. 2F and 2G are cross-sectional views of a warpage prevention layer disposed on the insulating layer, FIGS. 2H and 2I are cross-sectional views of a state in which a second insulating layer is stacked, FIG. 2J is a cross-sectional view of a state in which a circuit is formed on the second insulating layer, and FIG. 2K is a cross-sectional view of a solder resist stacked on the second insulating layer.

First, as illustrated in FIG. 2A, in the printed circuit board according to the exemplary embodiment of the present invention, the metal base 120 is prepared. The metal base 120 may be configured in a bimetal form in which the metal material 122 having a low coefficient of thermal expansion is stacked on one surface of the metal layer 121 having good conductivity. The metal material 122 on one surface of the metal layer 121 is metal having a remarkably lower CTE than that of the metal layer 121 and may mainly be the metal materials such as invar or alloys and may serve as the warpage prevention layer in the printed circuit board according to the exemplary embodiment of the present invention by the following process.

In this case, the metal layer 121 may be mainly made of a copper (Cu) material and the metal material 122 stacked on the metal layer 121 may be formed at a thickness smaller than that of the metal layer 121.

Next, the metal layer 121 of the metal base 120 may be patterned (see FIGS. 2B and 2C). The metal layer 121 may be provided with a circuit by patterning an opposite surface to a surface, on which the metal material 122 is stacked, by exposure, developing, and delamination processes using a dry film (DF). The circuit formed by patterning the metal layer 121 may be disposed on one surface of the metal material 122 in a copper post (Cu post) or a bump form.

Next, as illustrated in FIGS. 2D and 2E, the metal layer 121 may be embedded in the insulating layer 110 by pressing a pair of metal bases 120 provided with circuits on both surface of the insulating layer 110 having a predetermined thickness. The insulating layer 110 may be formed to have the same or similar thickness as or to a bonded thickness of the metal layer 121 of the metal base 120, which is pressed from above and below, within the insulating layer 110. In this way, the metal layer 121 is embedded in the insulating layer 110 at a predetermined interval by a pattern design and ends of the metal layer 121 may be connected to each other at a central portion of the insulating layer 110 to form the insulating layer 110 in which the metal layer 121 is embedded.

In this case, the metal material 122 of the metal base 120 is coated on both surfaces of the insulating layer 110, the metal layer 121 on one surface of the metal material 122 may be formed in a through hole form by connecting between ends of the metal layer 121 within the insulating layer 110, and the metal layer 121 may serve as the electrical conduction via by penetrating through the insulating layer 110. Herein, the insulating layer 110 may serve as the first insulating layer after the manufacturing of the printed circuit board and the pair of metal layers 121 connected within the insulating layer 110 may serve the discharge path of heat transferred through the insulating layer 110 while serving as the electrical conduction via as described above.

Next, as illustrated in FIGS. 2F and 2G, the warpage prevention layer 125 may be formed by patterning the metal material 122 coated on the first insulating layer 110. The dry film is applied on the metal material 122 and the dry film is applied to a position other than the position of the metal layer 121 of the first insulating layer 110 and the metal layer 121 is patterned by the exposure, developing, and delamination processes using the dry film to form the warpage prevention layer 125 made of a metal material.

The warpage prevention layer 125 may be disposed on the first insulating layer 110 other than the portion at which the metal layer 121 is formed and may be formed to have a resistance force to the warpage of the first insulating layer 110 due to the low coefficient of thermal expansion.

Herein, the patterning of the metal layer 121 illustrated in FIG. 2B and the warpage prevention layer 125 illustrated in FIG. 2G are not limited to a subtractive method using the dry film in the exposure, developing, and delamination processes and therefore may be applied with various circuit forming methods in addition to a semi additive process (SAP) method, a plasma semi additive process (PSAP) method, or the like.

Meanwhile, the warpage prevention layer 125 may be patterned to be simultaneously coated on the first insulating layer 110 and the metal layer 121. In this case, since the warpage prevention layer 125 may have a further extending length onto the metal layer 121 than the length of the warpage prevention layer illustrated in FIG. 2G, the resistance against the warpage, that is, the rigidity against the thermal expansion may be further imparted to the first insulating layer 110. In this case, the metal layer 121 coated with the warpage prevention layer 125 may be configured of a dummy metal layer which does not serve as the electrical conduction.

Next, as illustrated in FIGS. 2H and 2I, the second insulating layer 130 may be disposed on the first insulating layer 110 in which the metal layer 121 is embedded and the via hole 131 may be formed in the second insulating layer 130. The second insulating layers 130 may be stacked on both surfaces of the first insulating layer 110 and may be stacked with a build up film by a V-press method or prepreg by the lamination process. The second insulating layer 130 may be made of only the resin material, but may be made of the prepreg in which a core member and inorganic filler are impregnated so as to impart the rigidity against the occurrence of warpage at the time of the manufacturing process.

Further, the second insulating layer 130 may be provided with the via hole 131 by laser drilling or CNC drilling. The via hole 131 may be formed on the metal layer 121 of the first insulating layer 110 and in the case of the laser drilling, $CO_2$ laser may be used.

Next, as illustrated in FIG. 2J, the plating layer is disposed on the second insulating layer 130 and the pad 150 and the via 140 may be formed by patterning the plating layer. The via 140 is fill plated by filling the plating material in the via hole 131 at the time of forming the plating layer on the second insulating layer 130 and the plating layer connected to the via 140 is patterned by etching, and the like and thus a circuit including the pad 150 may be disposed on the via 140.

The via 140 is connected to the metal layer 121 and the pad 150 of the first insulating layer 110 to form an interlayer connection circuit and may be selectively connected among the plurality of metal layers 121 which are formed in the first insulating layer 110.

In this case, the via 140 is formed in an area other than the area in which the warpage prevention layer 125 is provided to insulate from the warpage prevention layer 125 and the second insulating layer 130 is applied between the via 140 and the warpage prevention layer 125 to completely insulate between the via 140 and the warpage prevention layer 125.

Finally, as illustrated in FIG. 2K, the solder resist layer 160 may be stacked on the second insulating layer 130. The solder resist layer 160 serves to protect the circuit in addition to the pad 150 from external environment and is provided with the opening through which the pad 150 formed on the via 140 may be exposed. The external connection unit 170 such as a solder ball and a bump may be disposed on the pad 150 exposed through the opening of the solder resist layer 160.

According to the printed circuit board manufactured by the above-mentioned manufacturing method, the metal layer 121 penetrating through the first insulating layer 110 is connected to the via 140 and the pad 150 which are formed in the second insulating layer 130 to serve to provide the electrical conduction and the heat radiation and the warpage prevention layer 125 insulated from the via 140 is disposed on the first insulating layer 110 to impart the rigidity to the first insulating layer 110 so as to facilitate the warpage control.

Second Exemplary Embodiment of Printed Circuit Board

Figure 3:
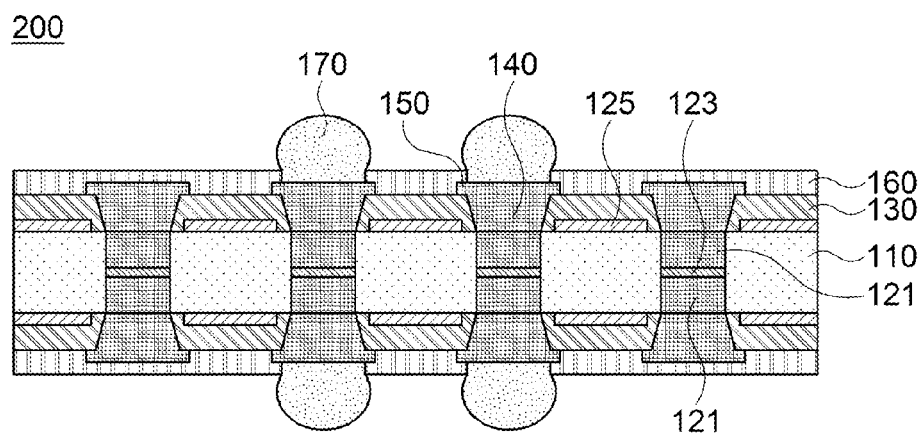
FIG. 3 is a cross-sectional view of a printed circuit board according to a second exemplary embodiment of the present invention.

Meanwhile, FIG. 3 is a cross-sectional view of a printed circuit board according to a second exemplary embodiment of the present invention.

As illustrated in FIG. 3, a printed circuit board 200 according to the second exemplary embodiment of the present invention may be configured of the first insulating layer 110 into which the metal layer 121 is inserted, the warpage prevention layers 125 which are stacked on both surfaces of the first insulating layer 110, the second insulating layers 130 which are stacked on both surfaces of the first insulating layer 110, the via 140 which is formed on the second insulating layer 130 to be connected to the metal layer 121, and the solder resist layer 160 which is stacked on the second insulating layer 130, in which the metal layer 121 may be bonded to an adhesive layer 123 within the first insulating layer 110.

In this case, the adhesive layer 123 may be made of a conductive paste or a conductive polymer.

Further, in the printed circuit board 200, the plurality of pads 150 which are connected to the vias 140 may be disposed on the second insulating layer 130 and the external connection units 170 electrically connected to the pads 150 may be disposed around the opening of the solder resist layer 160.

In this case, the external connection unit 170 is a solder ball, a bump, a pad, or the like and may be formed around the opening of the solder resist layer 160 in a protruding form.

According to the printed circuit board 200 according to the second exemplary embodiment of the present invention, the configuration in which the metal layer 121 penetrating through the first insulating layer 110 is adhesively bonded to the first insulating layer by the adhesive layer 123 is a component different from the printed circuit board according to the first exemplary embodiment of the present invention and therefore the configuration of the metal layer 121 bonded by the adhesive layer 123 and the insulating layer 110 in which the metal layer 121 is embedded will be described in more detail.

Further, among the components of the printed circuit board 200 according to the second exemplary embodiment of the present invention, the same components as those of the printed circuit board according to the first exemplary embodiment of the present invention are denoted by the same reference numerals and the detailed description of the same components as the first exemplary embodiment of the present invention will be omitted.

In the printed circuit board 200 according to the second exemplary embodiment of the present invention, the metal layer 121 embedded in the first insulating layer 110 may be configured in a form in which the metal layer 121 penetrates through the upper and lower portions of the insulating layer 110. In this case, the metal layer 121 is bonded to the first insulating layer 110 in a form in which the metal layers 121 having a thickness lower than that of the first insulating layer 110 at the upper and lower portions of the first insulating layer 110 are individually pressed and thus embedded in the first insulating layer 110 and the metal layer 121 may be bonded the first insulating layer 110 by interposing the conductive paste or the conductive polymer between the metal layer 121 to prepare for the case in which the metal layer 121 is not electrically connected to the first insulating layer 110 due to a height error of the metal layer 121 within the first insulating layer 110. Therefore, the adhesive layer 123 of the conductive material is interposed at the central portion of the metal layer 121 embedded in the first insulating layer 110 to provide the conduction without stopping a power supply to the metal layer 121.

In this way, the upper and lower portions of the metal layer 121 bonded by the adhesive layer 123 within the first insulating layer 110 may be formed to be exposed to an outer side of the first insulating layer 110 may serve to increase the rigidity against warpage by improving the residual rate of copper (Cu) within the printed circuit board.

Meanwhile, the warpage prevention layer 125 may be disposed on one surface or both surfaces of the first insulating layer 110 and may be made of metal materials such as invar or alloys having a low CTE.

The second insulating layer 130 and the solder resist layer 160 may be sequentially stacked on the first insulating layer 110 on which the warpage prevention layer 125 is stacked. The via holes are machined in the second insulating layer 130 and is thus filled with a plating material to form the vias 140. The via 140 is selectively connected to the metal layer 121 disposed on the first insulating layer 110 and the metal layer 121 may serve to conduct between the upper and lower portion of the printed circuit board through the plurality of vias 140. Further, the upper portion of the via 140 may be further provided with the pad 150 to which the external connection unit 170 is bonded.

Second Exemplary Embodiment of Method of Manufacturing Printed Circuit Board

A detailed method of manufacturing a printed circuit board according to the second exemplary embodiment of the present invention configured as described above will be clearly understood by the following detailed description.

Figure 4A:
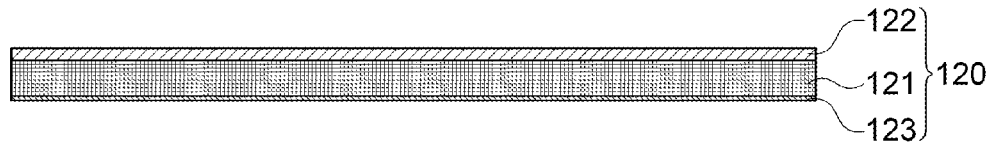
FIGS. 4A through 4K are process cross-sectional views illustrating a process of manufacturing a printed circuit board according to the second exemplary embodiment of the present invention.
Figure 4B:
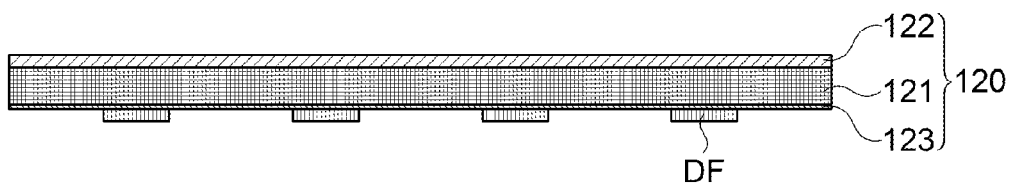
Figure 4C:
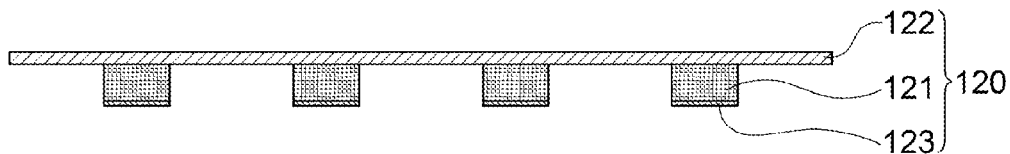
Figure 4D:
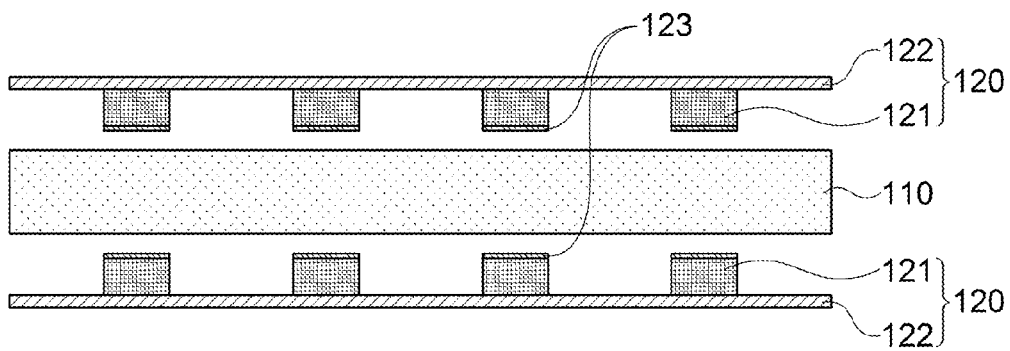
Figure 4E:
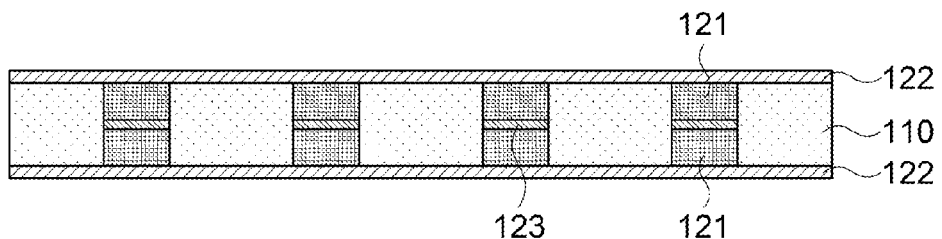
Figure 4F:
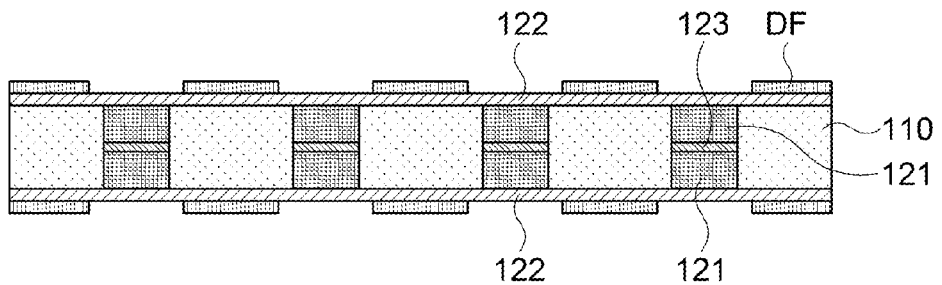
Figure 4G:
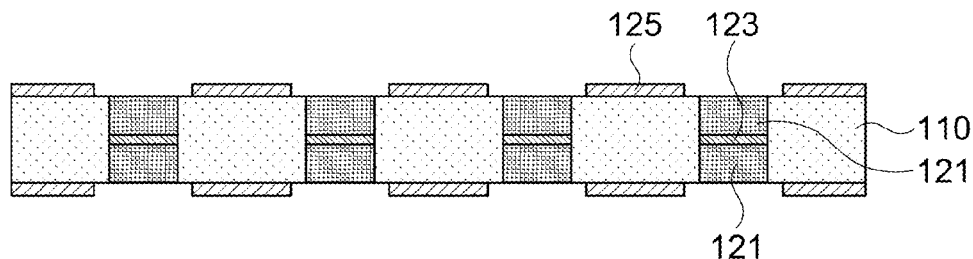
Figure 4H:
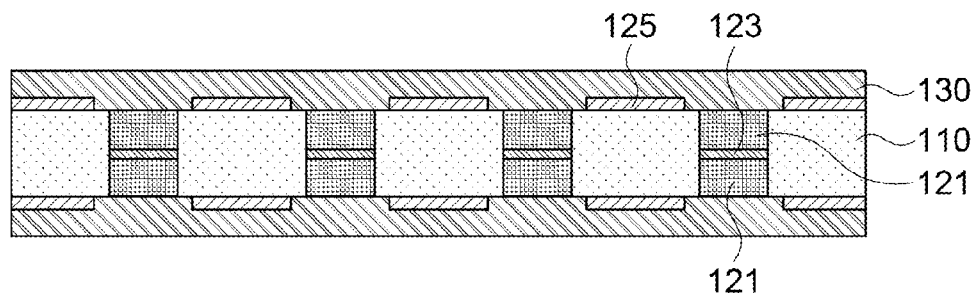
Figure 4I:
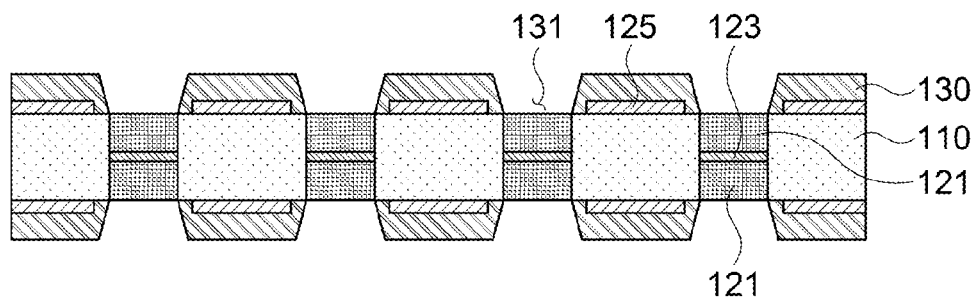
Figure 4J:
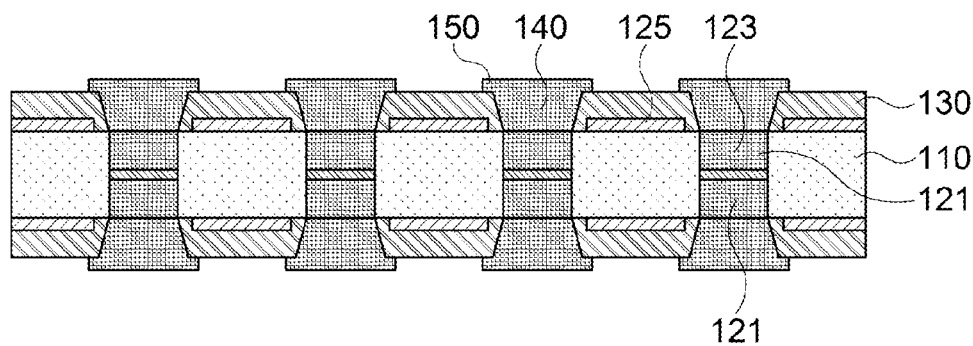
Figure 4K:
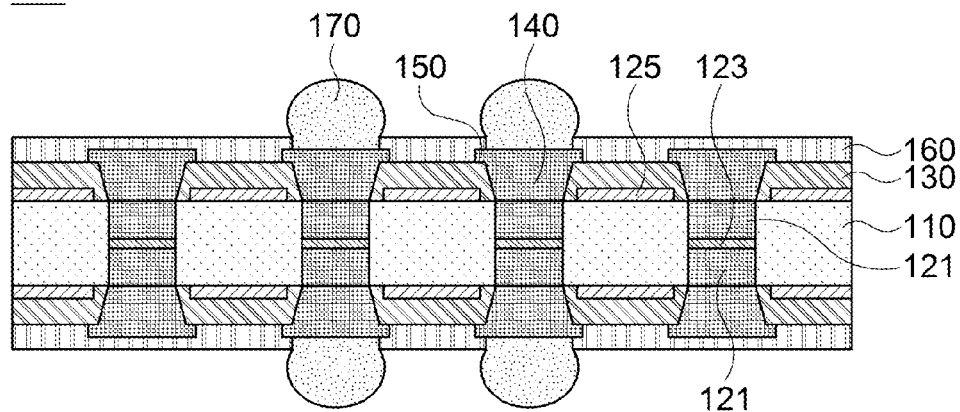

FIGS. 4A through 4K are process cross-sectional views illustrating a process of manufacturing a printed circuit board according to the second exemplary embodiment of the present invention, in which FIG. 4A is a cross-sectional view of a metal base, FIGS. 4B and 4C are cross-sectional views of a patterned metal layer of the metal base, FIGS. 4D and 4E are cross-sectional views of a state in which the metal layer is embedded into the insulating layer, FIGS. 4F and 4G are cross-sectional views of a warpage prevention layer disposed on the insulating layer, FIGS. 4H and 4I are cross-sectional views of a state in which a second insulating layer is stacked, FIG. 4J is a cross-sectional view of a state in which a circuit is formed on the second insulating layer, and FIG. 4K is a cross-sectional view of a solder resist stacked on the second insulating layer.

The detailed description of the printed circuit board according to the second exemplary embodiment of the present invention to be described below with reference to the process cross-sectional view of FIG. 4 which is the same as the process of manufacturing the printed circuit board according to the first exemplary embodiment of the present invention will be omitted and therefore the same components are denoted by the same reference numeral.

First, as illustrated in FIG. 4A, in the printed circuit board 200 according to the second exemplary embodiment of the present invention, the metal base 120 provided with the adhesive layer 123 is prepared. The metal base 120 may be configured in a bimetal form in which the metal material 122 having a low coefficient of thermal expansion is stacked on one surface of the metal layer 121 having good conductivity, and the adhesive layer 123 may be stacked on the other surface of the metal layer 121.

The metal material 122 is metal having a remarkably lower CTE than that of the metal layer 121 and may be made of metal materials such as invar or alloys. In this case, the metal layer 121 may be made of a copper (Cu) material and the metal material 122 stacked on the metal layer 121 may be formed at a thickness smaller than that of the metal layer 121.

Next, the metal layer 121 of the metal base 120 may be patterned (see FIGS. 4B and 4C). The metal layer 121 may be provided with a circuit by patterning an opposite surface to a surface, on which the metal material 122 is stacked, by exposure, developing, and delamination processes using a dry film (DF). The metal layer 121 is patterned and at the same time, the adhesive layer 123 is patterned and thus the end of the metal layer 121 may be provided with the adhesive layer 123.

Next, as illustrated in FIGS. 4D and 4E, the metal layer 121 may be embedded in the insulating layer 110 by pressing a pair of metal bases 120 provided with circuits on both surface of the insulating layer 110. Therefore, the metal layer 121 is embedded in the insulating layer 110 and the ends of the metal layer 121 disposed in the pair of metal bases 120 are connected to each other at the central portion of the insulating layer 110 to form the insulating layer 110 embedded in the metal layer 121.

In this case, the metal layer 121 is bonded within the insulating layer 110 by the adhesive layer 123 disposed at the ends thereof and thus even though the height of the metal layer 121 is lower than the designed height, the metal layers 121 may be electrically connected to each other by the adhesive layer 123 without stopping the power supply. The adhesive layer 123 may be made of a conductive paste or a conductive polymer.

The metal layer 121 may be formed in a through hole form, into which the adhesive layer 123 is interposed, by connecting between ends of the metal layer 121 within the insulating layer 110 and may serve as the electrical conduction via. Here, the insulating layer 110 serves as the first insulating layer after the manufacturing of the printed circuit board and may serve as the discharge path of heat transferred through the insulating layer 110.

Next, as illustrated in FIGS. 4F and 4G, the warpage prevention layer 125 may be formed by patterning the metal material 122 coated on the first insulating layer 110 and as illustrated in FIGS. 4H and 4I, the second insulating layer 1302 may be disposed on the first insulating layer 110 in which the metal layer 121 is embedded and the via hole 131 may be disposed on the second insulating layer 130.

Next, as illustrated in FIG. 4J, the plating layer is disposed on the second insulating layer 130 and the pad 150 and the via 140 may be formed by patterning the plating layer.

The via 140 is connected to the metal layer 121 and the pad 150 of the first insulating layer 110 to form an interlayer connection circuit and may be selectively connected among the plurality of metal layers 121 which are formed in the first insulating layer 110.

Finally, as illustrated in FIG. 4K, the solder resist layer 160 may be stacked on the second insulating layer 130. The solder resist layer 160 serves to protect the circuit in addition to the pad 150 from external environment and is provided with the opening through which the pad 150 formed on the via 140 may be exposed. The external connection unit 170 such as a solder ball and a bump may be disposed on the pad 150 exposed through the opening of the solder resist layer 160.

Third Exemplary Embodiment of Method of Manufacturing Printed Circuit Board

FIGS. 5A through 5L are process cross-sectional views illustrating a process of manufacturing a printed circuit board according to a third exemplary embodiment of the present invention and the method of manufacturing another exemplary embodiment for manufacturing a printed circuit board according to the first exemplary embodiment and the second exemplary embodiment of the present invention will be described in more detail.

Figure 5A:
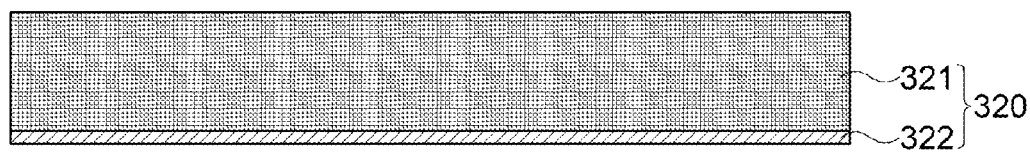
FIGS. 5A through 5L are process cross-sectional views illustrating a process of manufacturing a printed circuit board according to a third exemplary embodiment of the present invention.
Figure 5B:
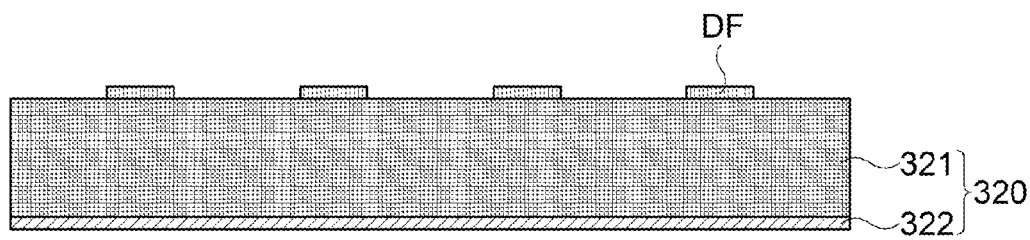
Figure 5C:
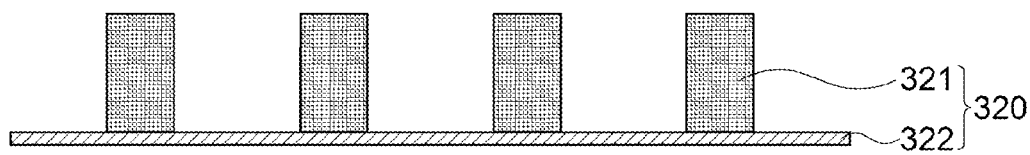
Figure 5D:
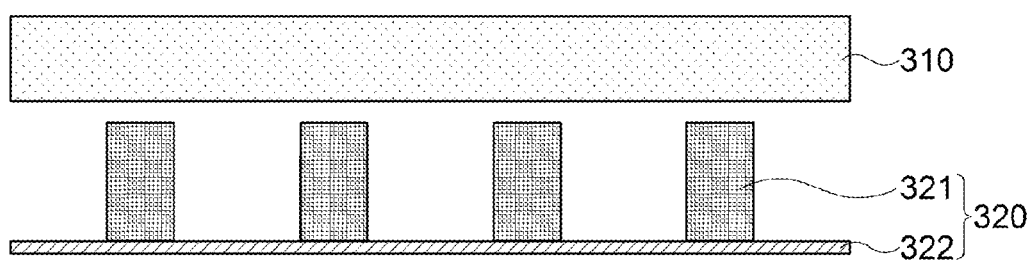
Figure 5E:
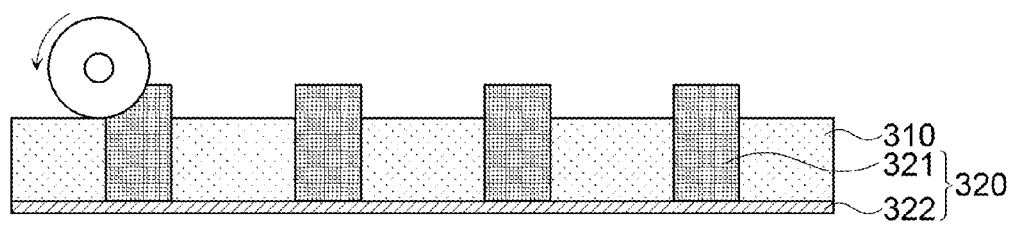
Figure 5F:
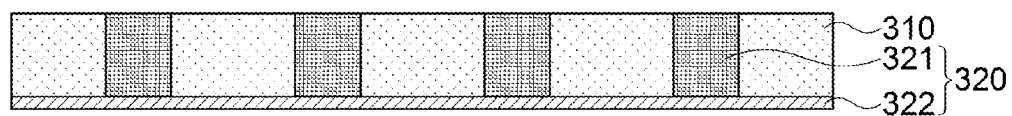
Figure 5G:
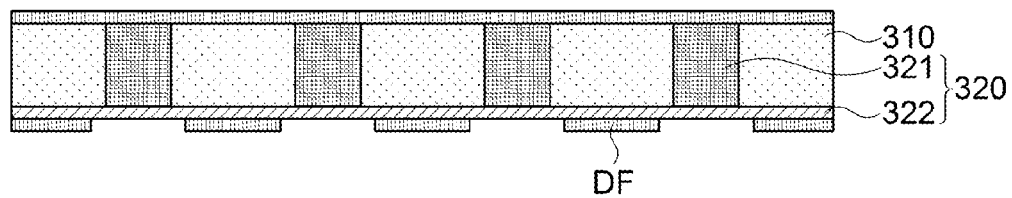
Figure 5H:
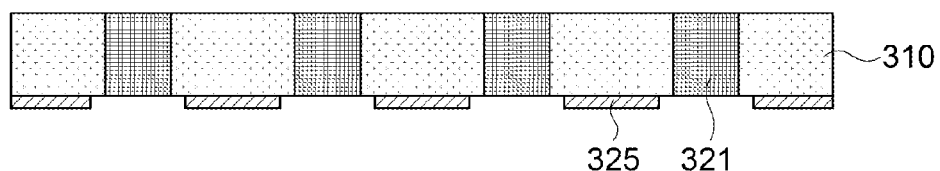
Figure 5I:
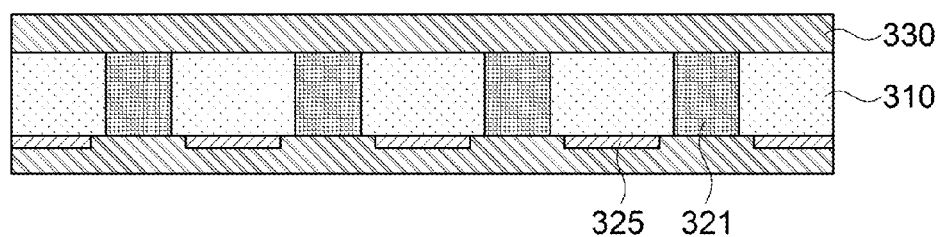
Figure 5J:
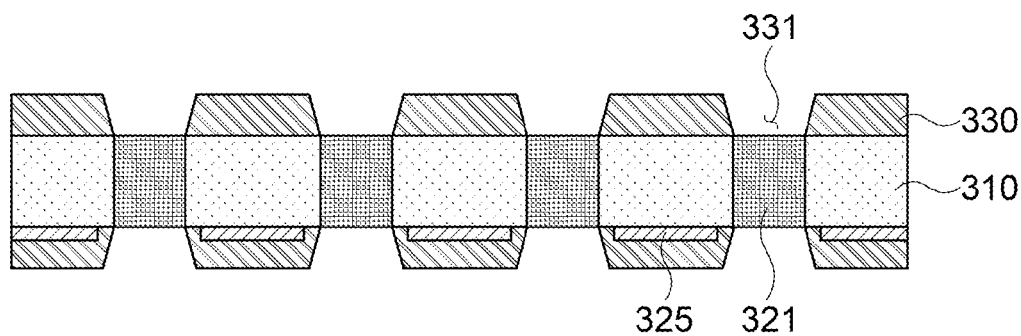
Figure 5K:
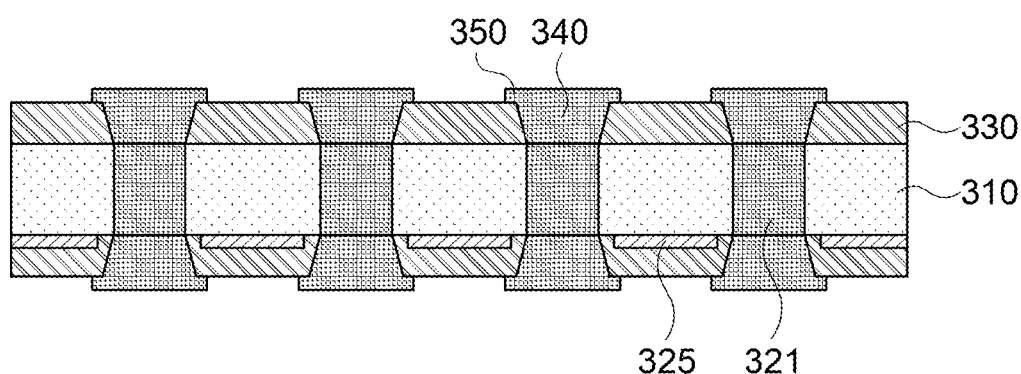
Figure 5L:
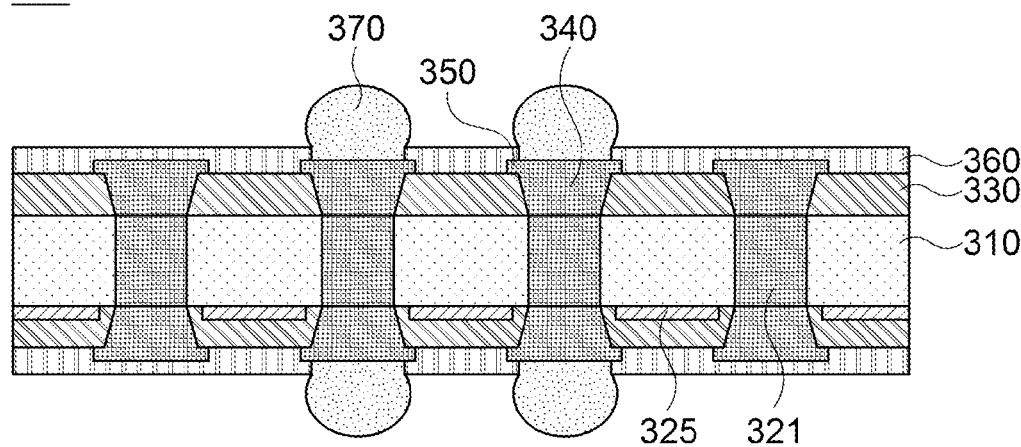

FIGS. 5A through 5L are process cross-sectional views illustrating a process of manufacturing a printed circuit board according to a third exemplary embodiment of the present invention, in which FIG. 5A is a cross-sectional view of a metal base, FIGS. 5B and 5C are cross-sectional views of a patterned metal layer of the metal base, FIGS. 5D and 5E are cross-sectional views of a state in which the metal layer is embedded into the insulating layer, FIG. 5F is a cross-sectional view of a state in which the metal layer is ground, FIGS. 5G and 5H are cross-sectional views of a warpage prevention layer disposed on the insulating layer, FIGS. 5I and 5J are cross-sectional views of a state in which a second insulating layer is stacked, FIG. 5K is a cross-sectional view of a state in which a circuit is formed on the second insulating layer, and FIG. 5l is a cross-sectional view of a solder resist stacked on the second insulating layer.

First, as illustrated in FIG. 5A, in a printed circuit board 300 according to the third exemplary embodiment of the present invention, a metal base 320 is prepared. The metal base 320 may be configured in a bimetal form in which a metal material 322 having a low coefficient of thermal expansion is stacked on one surface of the metal layer 321 having good conductivity. The metal material 322 on one surface of the metal layer 321 is metal having a remarkably lower CTE than that of the metal layer 321 and may mainly be the metal materials such as invar or alloys and may serve as the warpage prevention layer in the printed circuit board according to the exemplary embodiment of the present invention by the following process.

In this case, the metal layer 321 may be made of a copper (Cu) material and is formed at the same thickness as the insulating layer 310 applied in the following process or may be formed as a thickness larger than that of the insulating layer 310. The metal material 322 stacked on the metal layer 321 may be formed at a thickness smaller than that of the metal layer 321.

Next, the metal layer 310 of the metal base 320 may be patterned (see FIGS. 5B and 5C). The metal layer 321 may be provided with a circuit by patterning an opposite surface to a surface, on which the metal material 322 is stacked, by exposure, developing, and delamination processes using a dry film (DF). The circuit formed by patterning the metal layer 321 may be disposed on one surface of the metal material 322 in a copper post (Cu post) or a bump form.

Next, as illustrated in FIGS. 5D and 5E, the metal layers 321 may be bonded to each other in the insulating layer 310 to penetrate through the insulating layer 310 by pressing a pair of metal bases 320 patterned with circuits on one surface of the insulating layer 310 having a predetermined thickness. In this case, the thickness of the insulating layer 310 may be formed at the same or smaller as or than that of the metal layer 321.

As illustrated in FIG. 5E, the metal layer 321 may protrude outside the insulating layer 310 due to the thickness difference between the metal layer 321 and the insulating layer 310. As illustrated in FIG. 5F, the metal layer 321 protruding on the insulating layer 310 may be polished to have the same height as the insulating layer 310 by the grinding process. Therefore, the inside of the insulating layer 310 may be provided with the insulating layer 310, in which the metal layer 321 is embedded, at a predetermined interval by the pattern design.

In this case, the metal material 322 of the metal base 320 is coated on one surface of the insulating layer 310 and the metal layer 321 on one surface of the metal material 322 is configured of the through hole within the insulating layer 310 and may serve as the electrical conduction via. Herein, the insulating layer 310 may serve as the first insulating layer after the manufacturing of the printed circuit board and the pair of metal layers 321 inserted within the insulating layer 310 may serve the discharge path of heat transferred through the insulating layer 310 while serving as the electrical conduction via as described above.

Next, as illustrated in FIGS. 5G and 5H, the warpage prevention layer 325 may be formed by patterning the metal material 322 coated on one surface of the first insulating layer 310. The dry film is applied on the metal material 322 and the dry film is applied to a position other than the position of the metal layer 321 of the first insulating layer 310 and the metal layer 321 is patterned by the exposure, developing, and delamination processes using the dry film to form the warpage prevention layer 325 made of a metal material.

The warpage prevention layer 325 may be disposed on the insulating layer 310 other than the portion at which the metal layer 321 is formed and may be formed to have a resistance force to the warpage of the first insulating layer 310 due to the low coefficient of thermal expansion.

Next, as illustrated in FIGS. 5I and 5J, the second insulating layer 330 may be disposed on the first insulating layer 310 in which the metal layer 321 is embedded and the via hole 331 may be formed in the second insulating layer 330. The second insulating layers 330 may be stacked on both surfaces of the first insulating layer 310 and may be stacked with a build up film by a V-press method or prepreg by the lamination process. The second insulating layer 330 may be made of only the resin material, but may be made of the prepreg in which a core member and inorganic filler are impregnated so as to impart the rigidity against the occurrence of warpage at the time of the manufacturing process.

Further, the second insulating layer 330 may be provided with the via hole 331 by laser drilling or CNC drilling. The via hole 331 may be formed on the metal layer 321 of the first insulating layer 310 and in the case of the laser drilling, CO2 laser may be used.

Next, as illustrated in FIG. 5K, the plating layer is disposed on the second insulating layer 330 and the pad 350 and the via 340 may be formed by patterning the plating layer. The via 340 is fill plated by filling the plating material in the via hole 331 at the time of forming the plating layer on the second insulating layer 330 and the plating layer connected to the via 340 is patterned by etching, and the like and thus a circuit including the pad 350 may be disposed on the via 340.

The via 340 is connected to the metal layer 321 and the pad 350 of the first insulating layer 310 to form an interlayer connection circuit and may be selectively connected among the plurality of metal layers 321 which are formed in the first insulating layer 310.

In this case, the via 340 is formed in an area other than the area in which the warpage prevention layer 325 is provided to insulate from the warpage prevention layer 325 and the second insulating layer 330 is applied between the via 340 and the warpage prevention layer 325 to completely insulate between the via 340 and the warpage prevention layer 325.

Finally, as illustrated in FIG. 5I, the solder resist layer 360 may be stacked on the second insulating layer 330. The solder resist layer 360 serves to protect the circuit in addition to the pad 350 from external environment and is provided with the opening through which the pad 350 formed on the via 340 may be exposed. The external connection unit 370 such as a solder ball and a bump may be disposed on the pad 350 exposed through the opening of the solder resist layer 360.

As described above, according to the printed circuit board and the method of manufacturing the same according to the exemplary embodiments of the present invention, it is possible to increase the rigidity against warpage by improving a residual rate of copper (Cu) within the printed circuit board by embedding the metal layer into the first insulating layer.

Further, it is possible to increase the heat radiating effect by allowing the metal layer to serve as the discharge path of heat transferred through the insulating layer while serving as the electrical conduction via by making the metal layer penetrate through the insulating layer.

In addition, according to the printed circuit board according to the exemplary embodiments of the present invention, it is possible to easily control the warpage due to the addition of the rigidity to the insulating layer by disposing the warpage prevention layer insulated from the via on one surface or both surfaces of the first insulating layer.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A printed circuit board, comprising:
   a first insulating layer;
   a metal post penetrating the first insulating layer between one surface and another surface of the first insulating layer;
   a first warpage prevention layer stacked on the one surface of the first insulating layer and having a lower coefficient of thermal expansion than the metal post;
   a second insulating layer stacked on the one surface of the first insulating layer so as to cover the first warpage prevention layer;
   a via formed in the second insulating layer and connected to the metal post; and
   a solder resist layer stacked on the second insulating layer.

2. The printed circuit board according to claim 1, further comprising:
   a pad formed on the second insulating layer and connected to the via; and
   an external connection unit electrically connected to the pad and disposed in an opening of the solder resist layer.

3. The printed circuit board according to claim 1, wherein the first insulating layer is made of prepreg formed by impregnating a resin material into a fabric cloth or a glass cloth and the prepreg is further impregnated with organic filler.

4. The printed circuit board according to claim 1, wherein the first warpage prevention layer is formed on the one surface of the first insulating layer excluding a portion of the one surface of the first insulating layer which is penetrated by the metal post.

5. The printed circuit board according to claim 1, wherein the metal post comprises an adhesive layer formed between the one end and the other end.

6. The printed circuit board according to claim 5, wherein the adhesive layer is made of a conductive paste or a conductive polymer.

7. The printed circuit board according to claim 1, further comprising a third insulating layer stacked on the other surface of the first insulating layer.

8. The printed circuit board according to claim 7, further comprising a second warpage prevention layer stacked on the other surface of the first insulating layer and covered by the third insulating layer.

9. The printed circuit board according to claim 8, wherein the first warpage prevention layer and the second warpage prevention layer are each made of invar or an alloy.

* * * * *